(12) United States Patent
Verschuuren et al.

(10) Patent No.: US 10,088,747 B2
(45) Date of Patent: Oct. 2, 2018

(54) IMPRINTING METHOD, COMPUTER PROGRAM PRODUCT AND APPARATUS FOR THE SAME

(71) Applicant: KONINKLIJKE PHILIPS N.V., Eindhoven (NL)

(72) Inventors: Marcus Antonius Verschuuren, Berkel-Enschot (NL); Remco Van Brakel, Breda (NL); Hubertas Wilhelmus Jacobus Jozef Van de Laar, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 90 days.

(21) Appl. No.: 15/129,998

(22) PCT Filed: Mar. 20, 2015

(86) PCT No.: PCT/EP2015/055867
§ 371 (c)(1),
(2) Date: Sep. 28, 2016

(87) PCT Pub. No.: WO2015/150110
PCT Pub. Date: Oct. 8, 2015

(65) Prior Publication Data
US 2017/0192350 A1 Jul. 6, 2017

(30) Foreign Application Priority Data

Mar. 31, 2014 (EP) .................................... 14162774

(51) Int. Cl.
*G03F 7/00* (2006.01)
(52) U.S. Cl.
CPC ................. *G03F 7/0002* (2013.01)

(58) Field of Classification Search
CPC ..................................................... G03F 7/0002
See application file for complete search history.

(56) References Cited

U.S. PATENT DOCUMENTS

| 7,320,283 B2 | 1/2008 | Cavallini |
| 8,172,968 B2 | 5/2012 | Verschuuren |

(Continued)

FOREIGN PATENT DOCUMENTS

| WO | WO2005101466 A2 | 10/2005 |
| WO | WO2009141774 A1 | 11/2009 |

OTHER PUBLICATIONS

Marzolin, C. et al., "Fabrication of Glass Microstructures by Micro-Molding of Sol-Gel Precursors", Advanced Materials, 1998, vol. 10(8), p. 571-623.

*Primary Examiner* — Nathan L Van Sell
(74) *Attorney, Agent, or Firm* — Larry Liberchuk

(57) ABSTRACT

Disclosed is a method and apparatus for contacting a relief stamping surface of a flexible stamp with a receiving surface of a substrate. The method and apparatus can be used in an imprinting method. During the method and with the apparatus, creation or breaking of contact near a contact front (border) of a preformed contact area in which a part of a locally bent relief stamping surface is in contact with the stamp receiving surface, the speed of such creation or breaking is varied for different parts of the flexible stamp such that this contact front moves over the stamp receiving surface with different speed at different locations along a contact front movement trajectory on the stamp receiving surface. This may be used to optimize throughput when using such method and apparatus.

14 Claims, 6 Drawing Sheets

(56) References Cited

U.S. PATENT DOCUMENTS

| | | |
|---|---|---|
| 2004/0011231 A1 | 1/2004 | Hall |
| 2004/0197712 A1 | 10/2004 | Jacobson |
| 2004/0261981 A1 | 12/2004 | McCoy |
| 2004/0264019 A1 | 12/2004 | Curtiss |
| 2005/0173049 A1* | 8/2005 | Dona ..................... B05C 1/027 156/230 |
| 2005/0230882 A1 | 10/2005 | Watts |
| 2009/0140445 A1 | 6/2009 | Lu |
| 2009/0314414 A1* | 12/2009 | Verschuuren ............ B05D 1/28 156/64 |
| 2010/0083855 A1 | 4/2010 | Verschuuren |
| 2010/0102469 A1 | 4/2010 | Khusnatdinov |
| 2010/0244326 A1 | 9/2010 | Tokue |
| 2011/0094403 A1 | 4/2011 | Verschuuren |
| 2011/0183070 A1 | 7/2011 | Choi |

* cited by examiner

IMPRINTING METHOD, COMPUTER PROGRAM PRODUCT AND APPARATUS FOR THE SAME

FIELD OF THE INVENTION

The invention relates to a method of operating and apparatus for contacting a relief stamp surface of a flexible stamp to a stamp receiving surface of a substrate and/or for releasing a relief surface of a flexible stamp from a stamp receiving surface.

The invention further relates to a computer program product for executing the method of the invention.

The invention yet further relates to a control device for controlling an apparatus for contacting a relief stamp surface of a flexible stamp to a stamp receiving surface of a substrate and to an apparatus including the control device The invention finally relates to a method of imprinting a substrate.

BACKGROUND OF THE INVENTION

Imprint lithography is gaining interest as a viable alternative to more traditional (mask-based) optical lithography techniques employed for manufacture of semiconductor devices, because imprint lithography is able to provide patterning of comparable feature sizes at significantly lower cost.

In soft stamp imprint lithography techniques such as Substrate Conformal Imprinting Lithography (SCIL), a flexible stamp including a relief feature pattern on its surface is brought into contact with a substrate, which typically carries a (curable) resist material to be imprinted by the feature pattern. Thus, in a typical imprint lithography method, the imprint step includes that a layer of resist material on a substrate is brought in contact with the relief pattern surface of the flexible stamp. Following this step, the resist material is developed, e.g. cured to be solidified while still in contact with the relief pattern surface of the flexible stamp. Once solidified, the flexible stamp (and therewith its relief feature pattern) is released from the solidified resist material to leave a patterned solidified resist layer on the substrate.

When using soft stamps for imprint lithography, one way to carry out the imprint step is disclosed in US patent application 20100083855. The method includes that the flexible stamp is locally bent to have a partial area of the stamp surface protrude towards the substrate and create at that protrusion an initial area of contact between the flexible stamp surface and the substrate surface to be imprinted. After such initial contact has been made, the initial area of contact is then grown (e.g. extended) over a larger part of the flexible stamp and the substrate by gradually making further contact at or near the edge of the contact area such that the edge of the contact area moves along the substrate surface. After solidification of the resist material has occurred, release of the stamp is done using the reverse process of gradual breaking of contact.

In order to make such an imprint lithography process as commercially viable as possible, it is desirable to maximize the throughput of such a process. This, however, is far from trivial as increased throughput may compromise the quality of the pattern formed in the resist layer, for instance because the pattern is not accurately transferred, e.g. because insufficient conformal contact between the stamp and substrate is being created, or because an overly rapid release of the feature pattern of the stamp from the developed resist can lead to damage to the developed resist layer or even to the feature pattern on the stamp.

It is known per se that it is possible to individually optimize the throughput of the ensemble of imprinting step and release step of such an imprinting process, i.e. that these steps may be performed at different speeds. Typically, the imprinting step can be performed at higher speeds than the release step. This for instance may be because during the imprinting step the resist material is still low viscous and can flow while on the other hand, the release process is hampered by the interaction between the stamp material and the developed (solidified) resist, which slows down the release process in order to prevent damaging of the flexible stamp during release. This is due to the enhanced surface area between the stamp and the cured resist, which increases the van der Waals forces per unit area.

For instance, it is possible on an imprinting apparatus such as the apparatus disclosed in US patent 20100083855 to set the speed of an imprinting step and to set a different speed for a released step. There is still a further need to improve the throughput of an imprinting process as described above.

SUMMARY OF THE INVENTION

The invention aims to fulfil the aforementioned goal of providing improved throughput in soft stamp imprinting methods.

The invention is defined by the independent claims. The dependent claims provide advantageous embodiments.

According to the invention, the controlling of the system to create, or to break contact is such that the movement rate has a different value for at least two different locations along the movement direction of the contact front. Thus, the speed with which contact is created between relief stamping surface of the flexible stamp and the substrate surface for imprint of the substrate, or with which contact is broken between the relief stamping surface of the flexible stamp and the substrate surface for release of the flexible stamp from the substrate after imprint, is varied along an advancement trajectory of the contact front along the substrate surface. The speed of contacting or releasing is related to the rate with which the contact front can be or is moved along the trajectory along substrate surface. This can be influenced using the system of the apparatus in the appropriate way. There are many types of apparatuses, both existing and novel and inventive ones according to the invention, can perform such method as will be elucidated below and in the detailed description of this invention.

The invention is based on the recognition that often feature patterns to be imprinted on substrates include different areas with different relief topography such as feature density and/or, feature depth, and/or feature width etc. Furthermore, it has been found that with imprint lithography methods using a deformable imprint resist layer coated substrate, imprint speed is influenced, determined, or even limited by such relief topography, e.g. in areas with denser feature patterns, a higher capillary force at or near the contact front attracting the stamp to the substrate causes contact to be established more quickly and thus allows for faster imprint speed to be used in this area as compared to areas with less dense feature patterns. Similar argumentation holds for areas with deeper and/or narrower feature sizes. It has also been recognized that in areas with different relief topography release speed may be adjusted in order to safeguard the quality of the transferred pattern while optimizing the release speed of the flexible stamp from the substrate. For example, in e.g areas with denser and/or deeper feature patterns it will be more difficult to release the stamp from the solidified resist material on the substrate as compared to areas in with less dense and/or deep feature patterns. Hence in the latter type areas the release speed may be increased as compared to the first type areas. Conversely, less dense pattern regions may be released more quickly, i.e. at a higher release speed.

The invention thus allows optimization of imprint speed and/or release speed individually without compromising quality of the pattern transfer and/or integrity of the flexible stamp with all its small and vulnerable (nm to micrometer scale) features in order to improve the throughput of the imprint process.

The invention may therewith be advantageously used in an imprinting or micro contact printing method and apparatus.

In the invention the controlling of the system during the contacting step or the releasing step can comprise a first step and a second step, where in the first step, contact is created (for the contacting step), or broken (for the releasing step) such that the movement rate has a first constant value over a first predetermined distance along the movement direction, the first predetermined distance including one of the at least two different locations, and where, in the second step, contact is created (for the contacting step), or broken (for the releasing step) such that the movement rate has a second constant value over a second predetermined distance along the movement direction, the second predetermined distance including the other of the at least two different locations, the first constant value being different from the second constant value.

This allows defining of different imprint or release speed for different regional areas within the flexible stamp pattern with a predetermined distance along a contact front advancement trajectory for each of the regions. Thus, e.g. a peripheral region of a substrate may be defined to be treated with different speed as a central region of a substrate. Alternatively, or in addition, a design map of the imprint pattern present on a stamp may be used to set the predetermined distances along a certain defined contact front advancement trajectory along the substrate surface.

In the invention the first predetermined distance can correspond to a dimension of a first area of the relief stamping surface with a first relief topography and the second predetermined distance can corresponds to a dimension of a second area of the relief stamping surface with a second relief topography that is different from the first relief topography. Relief patterns of a flexible stamp typically can have regions where relief topography differs with regard to e.g. feature density and/or feature size (width or length dimensions of protrusions or indentations) and/or feature depth. Such regions typically may need different speed for imprint and/or release as described herein before and in the detailed description. As explained herein before, it has been recognised that e.g. in areas where the imprinting pattern is relatively dense, higher capillary forces will cause the conformal contact between stamp and substrate to establish more quickly, such that the imprinting speed can be increased in such regions. Similarly, the imprinting speed may be reduced for less dense areas of the imprinting pattern, where the assistance of such capillary forces is less pronounced or even absent.

The predetermined distances can be retrievable or retrieved from a lookup table in which such values are stored. The stored values can be based on the design map of the feature pattern of a stamp and can be prepared beforehand manually or otherwise.

If the apparatus comprises an inspection unit for inspecting the relief stamping surface the method can comprise inspecting the relief stamping surface with the inspection unit to determine the first area and the second area based on their relief topography and deriving from the first area the first predetermined distance and from the second area the second predetermined distance, along a direction in which movement of the contact front is to occur. Now a map of the feature topography can be automatically obtained and/or stored in e.g. the lookup table without having to prepare and store it beforehand. There may be continuous inspection of patterns during the contacting and/or releasing step combined with continuous adjustment of contacting or releasing speed based on inspection feedback. This will be advantageous for continuous contacting and/or releasing processes as in reel-to-reel imprinting.

With the invention, there can be both a contacting step and a releasing step. In such embodiment the movement direction of the contacting step and that of the releasing step are any one of the following: the same, opposite to each other, and making an angle towards each other. In an imprinting method that includes a step for contacting followed by a step of resist material curing as described in the background section, contacting and releasing in the same direction is advantageous for keeping contact time between stamp and imprint resist material constant during the imprint and curing step for each region of the relief stamping surface. For example because some resist materials require that the stamp takes op certain of its components (e.g. water and or other solvents) during solidification (curing). Alternatively, contacting and releasing in opposite direction can be advantageous when the apparatus has a preferred position for the stamp when detached form the substrate surface as for example when a fixed position stamp anchor surface is used as described in U.S. Pat. No. 8,172,968. Imprinting and releasing in directions which make an angle towards each other (such as e.g. 45 or 90 degrees) can be advantageous when feature patterns have certain symmetry. i.e. have long trenches in one direction while short ditches in the other direction. It may turn out that imprinting is best done in a direction perpendicular to the trenches while release is better parallel to the trenches.

If the system of the apparatus comprises a stamp holder for holding the flexible stamp and a plurality of stamp engaging elements, each of the stamp engaging elements being switchable between a first configuration in which the flexible stamp is attached and/or attracted to the stamp holder and a second configuration in which the stamp is released or pushed away from the stamp holder, the method can comprise that the controlling of the system includes successively switching of stamp engagement elements from the first state to the second state for creating contact (for the contacting step), or vice versa for breaking contact releasing. Preferably the plurality of such elements is arranged spatially along a movement trajectory of the contact front. The plurality of stamp engagement elements may be arranged in an array. Such a system and method allows good control of the process as with the plurality of stamp engagement elements distributed along a contact front advancement trajectory, the bending of the stamp can be controlled and shifted locally to have the contact front move along the surface. The switching elements may be elongated (as e.g. with aperture grooves in a plate) or square, circular etc. The periodicity of switching elements preferably is between 1 mm and 5 cm, but can be chosen differently. More preferably the distance is between 5 mm and 2 cm.

The method can include that during the contacting step, the rate of successive switching to the second state is reduced for a portion of the imprinting pattern having a reduced feature density as compared to the rate of successive switching to the second state for a portion of the imprint pattern having an increased feature density and/or the rate of successive switching to the second state is increased for a portion of the imprinting pattern having an increased feature density as compared to the rate of successive switching to the second state for a portion of the imprint pattern having a reduced feature density.

The higher capillary forces in more dense regions allow higher contacting speed when compared to less dense regions.

The method can include that during the releasing step, the rate of successive switching to the first state is reduced for a portion of the imprinting pattern having an increased feature density as compared to the rate of successive switching to the first state for a portion of the imprint pattern having a reduced feature density and/or the rate of successive switching to the first state is increased for a portion of the imprinting pattern having a reduced feature density as compared to the rate of successive switching to the first configuration for a portion of the imprint pattern having an increased feature density.

As explained herein before, it has been recognized that relief topography may require adjustment of speed for optimization, i.e. relatively dense pattern regions will be more difficult to release from the developed resist, such that the release speed of the stamp in such areas may be reduced in order to safeguard the quality of the transferred pattern. Conversely, less dense pattern regions may be released more quickly, i.e. at a higher release speed.

In an embodiment, the method may further comprise increasing the first rate upon a predetermined amount of the contact area being a contact area with the substrate. In other words, once conformal contact of sufficient quality has been established, the rate of adding stamp engagement elements (e.g. apertures; see below) to the pool of stamp engagement elements switched to first state may be increased in order to reduce the throughput time of the imprinting step.

In an embodiment, the step of periodically switching a next stamp engaging element in said array to the second staten at a first rate to increase the contact area between the flexible stamp and the substrate holder comprises creating a contact region between the flexible stamp and an outer region of the substrate; and reducing the first rate upon the contact area expanding towards a central region of the substrate.

If the system of the apparatus comprises a stamp holder having a stamp engaging surface and a substrate holder having a substrate engaging surface, the method can further comprise that during the contacting step and/or the releasing step the controlling is such that the stamp engaging surface and the substrate engaging surface are parallel to each other and distanced from each other with a gap. The gap should be such that the relief stamping surface and the stamp receiving surface do not make contact with each other before the contacting step.

Setting of the gap size can determine the speed during the contacting step or the releasing step and keeping the gap constant ensures that the speed is well controlled by other parameters (independent of gap size) over the entire surface to be imprinted.

Hence, in conjunction with, but also independent of the current invention wherein speed is varied during contacting or releasing, changing the gap size between a contacting step and a releasing step can be used to optimise speed of the entire process. Thus, the method according to the invention can comprise increasing the gap after the contacting step and/or before the releasing step.

In an embodiment, the method further comprises increasing the gap after developing the resist layer. It has been found that this allows for a larger force to be applied to the imprinting pattern engaging with the developed resist, which can be used to further reduce the duration of the release step, thereby further reducing the overall duration of the imprinting process. Moreover, this reduces the risk of pattern deformation when having to release areas at a slower rate, e.g. due to a higher feature pattern density in such areas, as the increased length of the stamp portion that spans from the stamp holder to the substrate holder improves the ability of this portion to absorb the increased forces that are generated upon initiating the release of such areas.

A method as claimed in any of the previous claims wherein the method comprises, a contacting step and after the contacting step, a curing step wherein the controlling of the system is to allow solidification of a resist layer present on, or forming the receiving surface of the substrate while it is in contact with the relief stamping surface. The contacting and releasing method is advantageously used to optimise speed and throughput for an imprinting method. Such method typically includes a step where in the contacting step a deformable imprint resist layer coated substrate is brought in contact with the relief stamping surface (i.e. is imprinted) after which during a curing step the imprinted resist layer is solidified (cured) sometimes called developed. The during step can comprise setting a parameter that determines time of contact between the imprint resist and the stamp and/or can include controlling of the system such that active curing occurs via illumination of the imprinted resist layer with e.g. radiation (actinic radiation) such as IR, extreme UV (<20 nm), UV-radiation, or visible light) or via application of heat.

A method as claimed in any of the previous claims wherein the method comprises, the contacting step and the releasing step. The contacting step may then comprise the two steps defining predetermined distances during creation of contact and the release step may then comprise the two steps defining the predetermined distances during breaking of contact. The predetermined distances can be the same if the contact front movement directions for contacting and releasing are the same (and start form the same location) and they can be the reverse if the contact front movement directions for contacting and releasing are opposite to each other.

The invention defines a computer program product downloadable from a communication network and/or stored on a computer-readable and/or microprocessor-executable medium, characterized in that it comprises program code instructions for implementing a method according to any one of the methods according to the invention. The computer program product preferably comprises code which allows a user to set any one of the parameters needed for performing the methods of the invention. Such parameters can include directional parameters as e.g. the predetermined distances and lateral (XY plane) directions along which contact front advancement is to be performed, or angles between such lateral directions. The parameters can include movement parameters which determine the contact front movement rate such as e.g. rate of switching of stamp engagement elements to make the contact front advance along the substrate surface, if such elements are present in the apparatus.

The computer program product can be in the form of computer code that can be remotely obtained by downloading from a remote server such as an internet server via e.g. a manufacturer's website or repository using a suitable data network such as LAN or WLAN or the like. Alternatively, it may be stored on a computer readable data carrier such as: memory including but not limited to processor unit embedded RAM, SRAM and the like, a permanent but rewriteable solid state memory such as FLASH or SD, or on optical (CD, DVD, Blue Ray or the like) or magnetic disk or tape or a remote based server such as an internet server.

The invention defines a control device for controlling an apparatus for contacting a relief stamping surface of a flexible stamp to a stamp receiving surface of a substrate wherein the control device is configured to be able to cause the apparatus to perform the method of the invention. Such control device is advantageous for reasons explained here in before. Preferably, the control device comprises a computer or a microprocessor and a computer program product according to the invention.

The control device can comprise a system for holding and manipulating the flexible stamp and/or the substrate holder such that when the system holds the flexible stamp and the substrate, the flexible stamp is or can be locally bent to create, on a part of the stamp receiving surface, a contact area within which a part of the relief stamping surface is in contact with the stamp receiving surface while a further part of the stamping surface is not in contact with the stamp receiving surface, at least a part of the border between the contact area and the non-contact area defining a contact front.

The a computer or microprocessor can be built in, or standalone from the control device as long as it has connections (electrical or other) to the relevant motors and other parts of the system for manipulating the stamp and or substrate, and/or inspection unit, and/or units for active curing (see below).

The control device can comprise a stamp holder for holding the flexible stamp and a plurality of stamp engaging elements, each of the stamp engaging elements being switchable between a first configuration in which the flexible stamp is attached and/or attracted to the stamp holder and a second configuration in which the stamp is released or pushed away from the stamp holder. Preferably the plurality of such elements is arranged spatially along a movement trajectory of the contact front. The plurality of stamp engagement elements may be arranged in an array. Such a system and method allows good control of the process as with the plurality of stamp engagement elements distributed along a contact front advancement trajectory, the bending of the stamp can be controlled and shifted locally to have the contact front move along the surface. The switching elements may be elongated (as e.g. with aperture grooves in a plate) or square, circular etc. The periodicity of switching elements preferably is between 1 mm and 5 cm, but can be chosen differently. More preferably the distance is between 5 mm and 2 cm.

Preferably, the stamp engagement elements comprise an aperture for providing an underpressure to attach and/or attract the flexible stamp, or for providing an overpressure to release and/or push away the flexible stamp, and wherein the control device further comprises a pressure regulator including switchable valves for individually setting the underpressure and/or overpressure of each one of the apertures of the plurality of stamp engaging elements. Good operation at low complexity and therewith cost is achieved. It can make use of flexible stamps that have no metal or magnetic parts suitable for engagement of the stamp engagement elements.

The apertures can be groove-shaped (elongated trenches in stamp holder surface), although it should be understood that any suitable shape may be used for these apertures, e.g. round shapes, oval shapes, oblong shapes and so on.

Preferably, each aperture comprises a valve for switching the aperture between an underpressure channel for the first state and an overpressure channel for the second state, said valve being controlled by said processor or computer. In addition to the valves, the control device can include a pressure regulator also controlled by said processor or computer. This provides simple first and second state generation for stamp engaging elements having an aperture for providing the over and/or underpressure.

The method may further comprise varying the overpressure during the imprinting step and/or during the release step. For instance, during the imprinting step overpressure may be increased during the establishment of the initial contact between the stamp and substrate to reduce the time required for establishing the conformal contact, whereas in the release step the overpressure may be reduced to partially release the stamp from the stamp holder, thereby increasing the length of the section of the stamp bridging the gap. This allows for a larger force to be applied to the imprinting pattern, which can be used to aid release in areas where the stamp carries a particularly dense feature pattern. In addition, the lowering of the overpressure during the release step will lead to less leakage from a pressurized area of the stamp to vacuum, which helps to achieve an improved vacuum, assists in facilitating an increase of the release speed of the stamp from the developed resist.

Alternatively, or in combination with the pneumatic stamp engagement elements, a control device can have a plurality of stamp engaging elements comprising an electromagnet for providing a magnetic force to attach or attract the flexible stamp or for providing a magnetic force to release and/or push away the flexible stamp, and wherein the control device further comprises electrical equipment for switching appropriate attach/attract and/or release/push away electrical signals to each individual one of the electromagnets of the plurality of stamp engaging elements. This allows manipulation of flexible stamps having metal or magnetic parts as stamp engagement element attachment parts.

The control device preferably comprises a switching unit for providing settings for each of the plurality of stamp engagement elements such that these settings can be variable during a contacting step and/or during a releasing step.

The invention defines an apparatus for contacting a relief stamping surface of a flexible stamp to a stamp receiving surface of a substrate, the apparatus comprising a system for holding and manipulating the flexible stamp and/or for manipulating the substrate holder such that when the system holds the flexible stamp and the substrate holder holds the substrate, the flexible stamp is or can be locally bent to create, on a part of the stamp receiving surface, a contact area within which a part of the relief stamping surface is in contact with the stamp receiving surface while a further part of the stamping surface is not in contact with the stamp receiving surface, at least a part of the border between the contact area and the non-contact area defining a contact front; and a control device according to the invention.

The stamp holder preferably is movably mounted and controlled by said processor Such an imprinting apparatus benefits from the increased throughput it can provide, thereby facilitating a significant cost reduction in imprinting processes executed by the apparatus.

The apparatus can further comprising an inspection device for inspecting the relief feature topography of a flexible stamping surface when a flexible stamp is affixed in the system for holding and manipulating the flexible stamp. The inspection unit can be a camera such as a CCD camera, or a relief profile meter.

The apparatus can further comprise a device for active curing. Such device can be an exposure unit for providing the appropriate (see above) radiation to the substrate and a resist layer. It may comprise an, a UV lamp, or a visible light lamp. Alternatively, or in addition, the device can include a heating element. The heating element may be direct heating element incorporated in the substrate and/or stamp holder, or a distanced heating element for providing radiative heat such as with an IR lamp.

The method of the invention can comprise an initial contacting step for providing the contact area. Thus, the contacting area can be created by using the same system as used for manipulating the stamp and substrate.

In an embodiment, the substrate holder may comprise an edge portion for surrounding the substrate, where the edge portion is for forming contact area during the initial contacting step.

It is advantageous if the parameters for the controlling of the system to perform any of the methods can be set using buttons or with software. Thus the method can comprise setting one or more directional parameters that determine the direction of movement for the contacting step and/or the releasing step; and setting one or more movement parameters that determine the movement rate for the contacting action and/or the releasing action. If the apparatus comprises a plurality of stamp engagement elements to manipulate the flexible stamp, then movement parameters can comprise a rate at which successive of such stamp engagement elements are switched from a first state to a second state (see below).

The invention provides a method of imprinting using contacting and releasing a relief stamping surface of a flexible stamp to a stamp receiving surface of a substrate, the method comprising the following successive steps:

providing a flexible stamp including a relief stamping surface;

providing a substrate including a stamp receiving surface that is made of a deformable imprint layer;

using a system for holding and manipulating the flexible stamp and/or for holding and manipulating the substrate to locally bend the relief stamping surface to create, on a part of the stamp receiving surface, a contact area within which a part of the relief stamping surface is in contact with the stamp receiving surface while a further part of the stamping surface is not in contact with the stamp receiving surface, at least a part of the border of the contact area defining a contact front;

contacting the relief stamping surface to the stamp receiving surface, the contacting step comprising a controlling of the system to create contact near or at the contact front such that the contact front moves with a movement rate along the stamp receiving surface of the substrate along a movement direction substantially perpendicular to the contact front and away from the contact area;

solidifying the deformable imprint layer while the stamp receiving surface is in contact with the relief stamping surface;

releasing the relief stamping surface from the stamp receiving surface in a contact area, the releasing step comprising a controlling of the system to break contact near or at the contact front such that the contact front moves with a movement rate along the stamp receiving surface of the substrate along the stamp receiving surface of the substrate along a movement direction substantially perpendicular to the contact front and towards the contact area, wherein, the controlling of the system to create, or to break contact is such that the movement rate has a different value for at least two different locations along the movement direction.

The invention thus provides a method of imprinting of a deformable substrate surface layer with a relief stamping surface of.

The method may be a substrate conformal imprinting lithography (SCIL) method or any other suitable imprinting method.

BRIEF DESCRIPTION OF THE DRAWINGS

Embodiments of the invention are described in more detail and by way of non-limiting examples with reference to the accompanying drawings. The figures are merely schematic and are not drawn to scale. Throughout the figures, the same reference numerals indicate the same or similar parts.

DETAILED DESCRIPTION OF THE EMBODIMENTS

Figure 1:
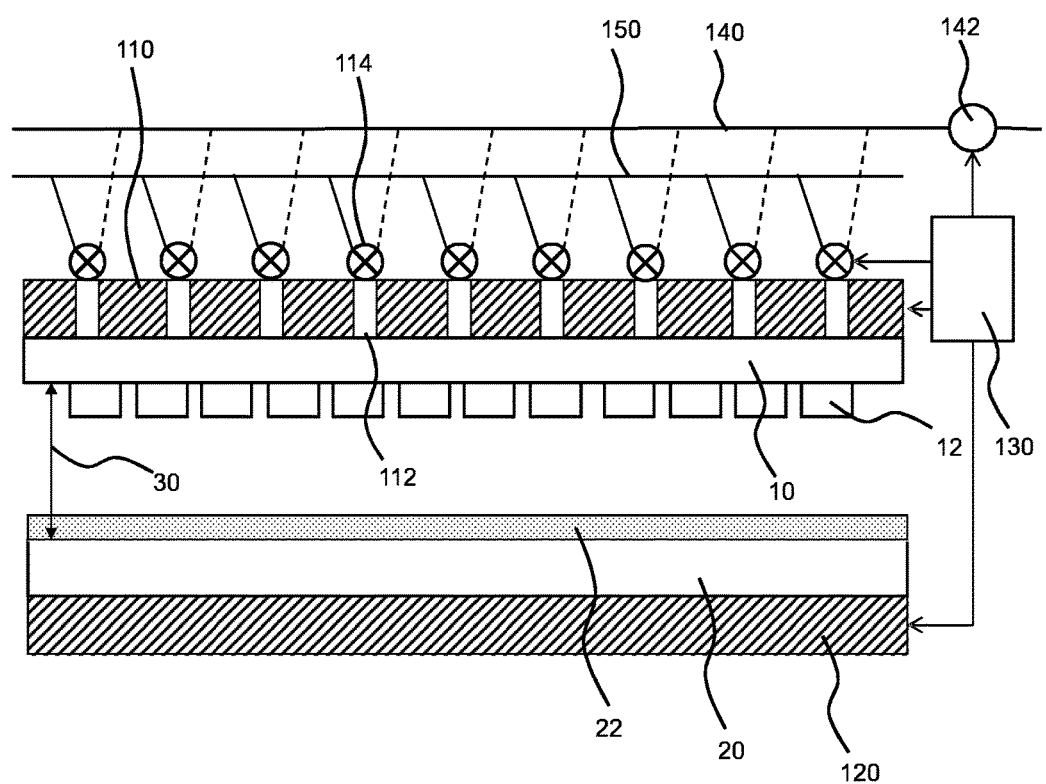
FIG. 1 schematically depicts an imprinting apparatus according to an embodiment of the present invention.

FIG. 1 depicts an imprinting apparatus 100 according to an embodiment of the present invention. The particular imprinting apparatus 100 is of the type as disclosed in US20100083855 or U.S. Pat. No. 8,172,968 or US20050173049. However, the invention is equally applicable to other imprinting apparatus suitable for transfer of a nanometer to micrometer size feature pattern scale imprinting pattern from a flexible stamp to a substrate such as disclosed in e.g. US20040011231 or US20040197712 as will be further elucidated further below. These disclosures are incorporated herein by reference.

The imprinting apparatus 100 comprises a system for holding and manipulating a flexible stamp and a substrate. The system includes a first holder or carrier 110 for holding a flexible stamp 10 including an imprinting pattern 12 in the form of a relief stamping surface of the flexible stamp 10.

The imprinting apparatus 100 further comprises means for positioning and repositioning the stamp holder 110 relative to the substrate holder 120 including in three dimensions represented by the three Cartesian coordinates X, Y and Z. Furthermore, there may be provided means for adjusting the relative positions laterally (in a direction parallel to the substrate holder 120), vertically (in a Z-direction perpendicular to the substrate holder 120) both using translation and orientation. Thus for sake of clarity, the Z-direction is perpendicular to the XY plane and parallel to distance direction 30 indicated in FIG. 1. In this example the apparatus includes automated displacement devices. The automated displacement means may include for example mechanical or electrical units providing mechanical or electrical feedback mechanisms for precisely controlling the relative XYZ positions and orientation of the stamp holder 110 relative to the substrate holder 120. Such displacement means are known per se and are therefore not described in any further detail for the sake of brevity only.

The substrate holder 120 optionally may also be part of the system but this is not necessary. It may be independently controlled in a manner analogous to the above control means for the stamp holder 110, to increase the degrees of freedom of the imprinting apparatus 100. However, it is equally feasible to provide an imprinting apparatus 100 having a stationary or fixed substrate holder 120.

The stamp may have features in the form of protrusions and/or grooves in an otherwise flat stamp to form the imprint pattern according to a relief pattern. The flexible stamp 10 and imprinting pattern 12 may be realized in any suitable material e.g. a suitable (synthetic) rubber material such as a polysiloxane-based material, e.g. polydimethylsiloxane (PDMS). US 20110094403 discloses materials and methods of manufacturing such PDMS flexible stamps in detail. In the present case the flexible stamp 10 comprises a thin flexible glass plate as a support at its back side opposite to the relief side of the flexible stamp 10. This plate is however not shown in FIG. 1 for clarity and is assumed to be part of the body of the flexible stamp 10. The feature size of the imprinting pattern (i.e. the protrusions and/or grooves) may be any suitable size, and preferably is a nanometer to micrometer scale, that is, a pattern having feature sizes as low as 10 nm up to in excess of 1 mm, where an aspect ratio (vertical dimensions divided by lateral dimensions) of the features may be 8 or higher. It should however be understood that other feature sizes may also be contemplated, and that the present invention may be equally well applied to transfer patterns having smaller aspect ratios. For instance, at least some embodiments of the present invention are suitable to transfer imprinting patterns with an aspect ratio in the range of 0.001 to 10.

The stamp holder 110 comprises a plurality of stamp engaging elements 112, which may be arranged in an array or grid across the surface (extending perpendicular to the plane of drawing) of the stamp holder. Such stamp engaging elements 112 are typically arranged to pull a portion of the flexible stamp 10 towards the stamp holder 110 in a first configuration and to release, or push away the portion of the flexible stamp from the stamp holder 110 in a second configuration. In FIG. 1, the stamp engaging elements 112 are embodied by apertures that can be switched between an underpressure (vacuum) and an overpressure in order to provide the first and second configuration is respectively. However, it is equally feasible to use other types of stamp engaging elements 112, e.g. mechanical stamp engaging elements and/or electrical stamp engaging elements using magnetic and/or electrical activation for exerting corresponding forces to a suitable flexible stamp.

Figure 6:
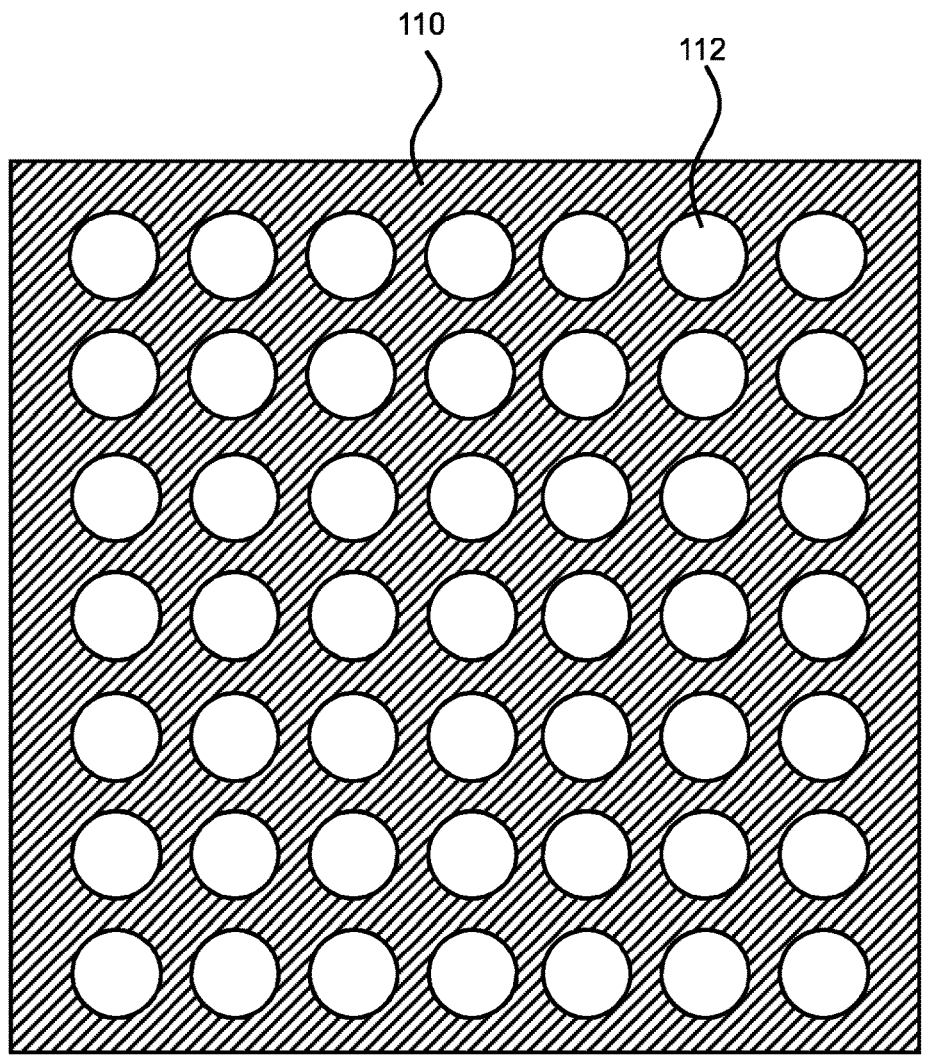
FIG. 6 schematically depicts an aspect of an imprinting apparatus according to an embodiment of the present invention suitable of facilitating the imprinting process of FIG. 5.

The apertures 112 may have any suitable shape. For instance, the apertures 112 may be groove-shaped, with the grooves extending over substantially the whole length or width of the stamp holder 110; the apertures 112 may be a circular-shaped, with the apertures 112 defining a two-dimensional grid, as shown in FIG. 6. Other suitable shapes will be apparent to the skilled person. Groove-shaped apertures 112 are for instance suitable in case the imprinting direction and the release direction of the flexible stamp are the same or opposite to each other, as will be explained in more detail later. The two-dimensional grid of circular or other shaped (such as square) apertures 112 as shown in FIG. 6 for instance is particularly suitable in case the imprinting direction and the release direction of the flexible stamp 10 are different to each other, as will be explained in more detail later.

Distance between stamp engaging elements of the invention may be chosen to be in a range of several cm to several mm.

Each aperture 112 comprises a valve 114 that can switch the aperture 112 between an overpressure source provided via first channel 140 (from here on referred to as the overpressure channel) and an under pressure source, e.g. vacuum pump, provided via second channel 150 (from here on referred to as the underpressure channel). The connection between each valve 114 and the underpressure channel 150 is shown by solid lines and the connection between each valve 114 and the overpressure channel 140 is shown by dashed lines.

The respective valves 114 are controlled by a control device. The control device includes a processing element or micro)processor) 130, which may take any suitable shape or form, but typically has the form of a semiconductor Integrated Circuit or Integrated circuit made of discrete electrical components. The processing element 130 typically executes computer program code that instructs the processing element 130 on how to control the valves 114 and the stamp holder stamp holder 110 and/or the substrate holder 120 during the imprinting process. The control device preferably includes computer readable medium such as semiconductor memory (RAM or FLASH or the like type) or magnetic disk or optical disk that includes the computer program code.

Additionally or as an alternative to the above control device, the control device can comprise the valve system that allows individual setting of pressures for each of the stamp engaging elements. For performing the method of the invention, a flexible stamp 10 may be affixed to the stamp holder 110 by switching the apertures 112 to an underpressure. Additional affixing means may be provided, for instance around an edge portion of the flexible stamp 10. Such affixing means may for instance comprise clamps clamping the edge of the flexible stamp 10 to the stamp holder 110 although it should be understood that in at least some embodiments no additional affixing means are being used.

The method to be executed using the apparatus can be performed for any suitable substrate 20, e.g. any semiconductor substrate such as a silicon substrate, a silicon-on-insulator (SOI) substrate, a silicon germanium substrate, a glass or quartz or polymeric or plastic substrate can be used, all in conjunction with a suitable imprintable layer that is either part of the substrate or applied to it. Such substrates can be flat or (partly) curved, transparent or non-transparent such as glass, rigid polymers (polycarbonate) or quartz.

To enable imprinting, the substrate 20 in this case carries a resist layer 22, which may be any suitable material for imprinting. For instance, the resist layer 22 may comprise a liquid (of some suitable viscosity) curable material that may be solidified (cured) to immobilize the imprinting pattern 12 in the resist layer 22. In this example, the resist layer 22 comprises a sol-gel material. A suitable example of such a material is disclosed in WO 2009/141774 A1. Further examples of suitable resist materials for instance can be found in US 2004/0261981 A1, WO 2005/101466 A2, US 2005/0230882 A1, US 2004/0264019 as well as in the non-patent publication Advanced Materials, 1998, Vol. 10(8), page 571. In the example, the stamp holder 110 is controlled by the processing element 130 of the control device according to specific instructions.

The stamp holder 110 is positioned relative to the substrate holder 120 such that the flexible stamp is separated from the substrate by a gap 30, which gap size may be controlled by the processing element 130, e.g. by engaging the means for positioning and repositioning the stamp holder 110 relative to the substrate holder 120.

In a particular embodiment, when there are distinct imprinting and processing steps, the processing element 130 may be programmed to alter the gap size in between the imprinting step and the release step. Specifically, the processing element 130 may be programmed to increase the gap size upon completion of the imprinting step (and after developing the resist layer 22) as increasing the gap size can aid the release of the imprinting pattern 12 from the developed resist layer 22, as will be explained in more detail below.

In the example the overpressure channel 140 includes a pressure regulator 142 under control of the processing element 130. This for instance facilitates varying the overpressure during an imprinting or release step as will be explained in more detail later.

The imprinting apparatus 100 may have a user interface, e.g. a user terminal including at least one instructions input device such as a keyboard, mouse, trackball, and so on for allowing the user to configure the imprinting apparatus 100 in accordance with the desired imprinting process. It should be understood that any suitable user interface may be used.

As mentioned above, the processing element 130 is arranged to control the stamp holder 110, the valves 114 and/or the pressure regulator 142 in accordance with an embodiment of the imprinting method of the present invention. To this end, the imprinting apparatus 100 possibly as part of the control device further comprises a computer-readable data storage medium (not shown), such as a memory device, e.g. Flash memory, RAM or ROM, a solid state disk, a magnetic disk and so on. The data storage medium comprises computer program code for execution by the processing element 130, which computer program code causes the processing element 130 to implement the various steps of the imprinting method in accordance with embodiments of the present invention. The data storage medium may be located in any suitable location of the imprinting apparatus 100; the data storage medium may be integral to the processing element 130 or may be a discrete component accessible by the processing element 130 in any suitable manner, e.g. over a data communication bus or a point-to-point connection between the processing element 130 and the data storage medium. The processing element can be connected to a data network such as LAN wireless LAN or similar for transferring data and/or transferring, or downloading or executing the computer program product.

When a substrate and flexible stamp have been inserted in the apparatus described above, an imprinting process using the imprinting apparatus 100 and according to the invention can be as follows. A flexible stamp 10 comprising a relief pattern 12 is affixed to the stamp holder 110, for instance by switching the valves 114 such that the apertures 112 are connected to underpressure channel 150, which channel may be connected to an underpressure-providing source such as a vacuum pump. The stamp holder 110 is subsequently positioned relative to the substrate holder 120 carrying the substrate 20 coated with a suitable resist layer 22, such that the relief pattern 12 faces the resist layer 22. The stamp holder 110 is typically positioned relative to the substrate holder 120 such that a gap 30 exists, which gap 30 may be defined by the user of the imprinting apparatus 100 to ensure that a good conformal contact forms between the flexible stamp 10 and the substrate 20 during imprinting. The gap 30 may be chosen in any suitable range; for instance, in a process in which the imprinting pattern 12 is a nanometer scale feature pattern, the gap 30 can be chosen in a range from 10-500 µm, preferably in a range from 20-200 µm, more preferably in the range from 10-100 µm. See also US20100083855 for further details of how to set the gap. Upon positioning the stamp holder 110 relative to the substrate holder 120, the imprinting process proceeds with an imprinting step, in which a (initial) contact area 24 is created where the relief stamping surface 12 of the flexible stamp 10 and the receiving surface of the substrate 20 are in contact with each other. In this example the relief stamping surface will be embedded in the resist layer in this contact area. The contact area 24 is gradually expanded or displaced over the substrate surface until the entire imprinting pattern 12 intended to contact the substrate 20 has been brought into contact with this substrate at one point in time. The detailed process for this is explained in with the aid of FIG. 2. It is noted that in FIG. 2 the imprinting pattern 12 has been omitted for the sake of clarity only; this should not be construed as the imprinting pattern being absent.

Figure 2:
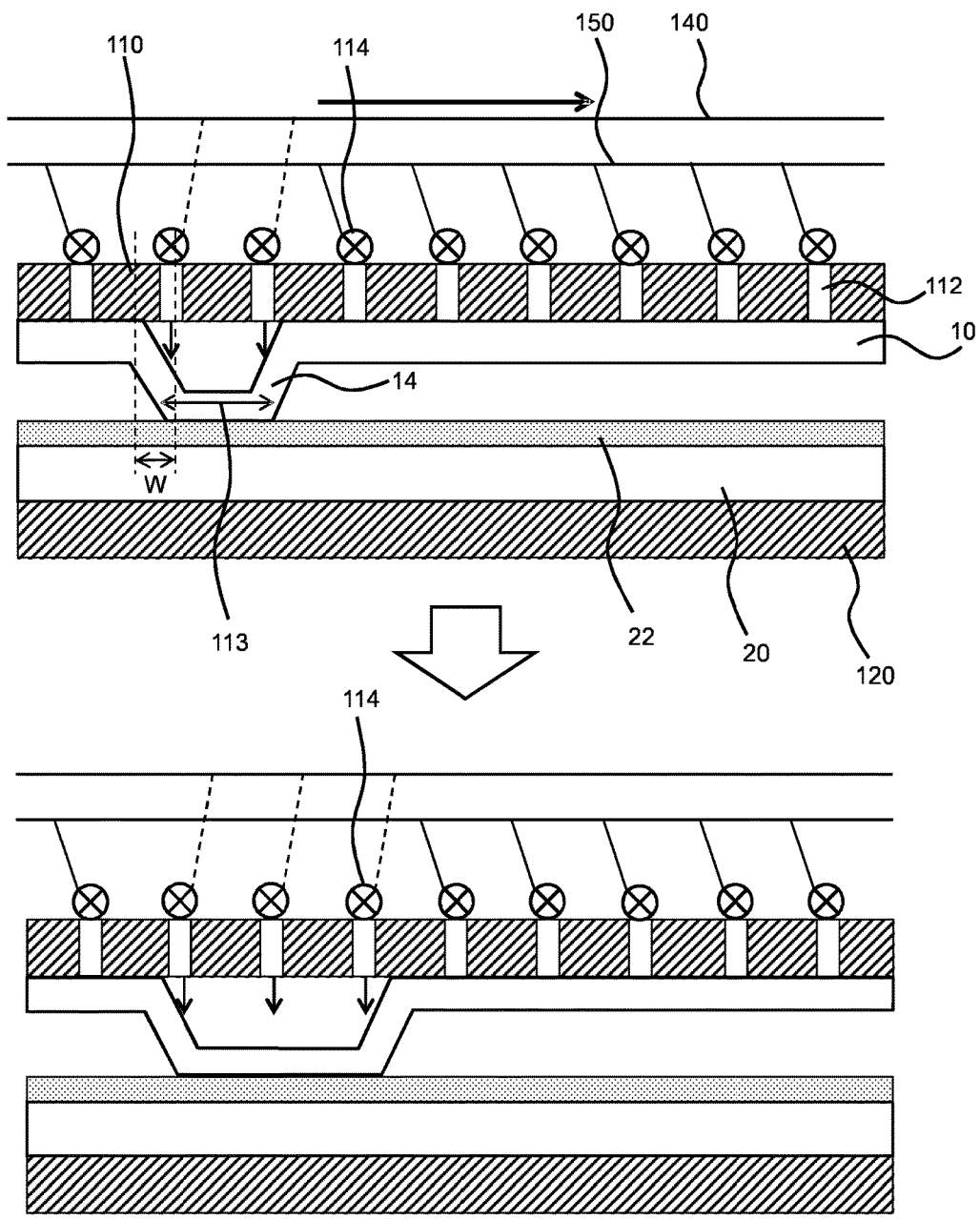
FIG. 2 schematically depicts an imprinting cycle using the imprinting apparatus of FIG. 1.

As can be seen in the upper pane of FIG. 2, an initial contact area 24 is created between the flexible stamp 10 and the substrate 20 by individually switching selected apertures 112 from underpressure to overpressure in the direction of the horizontal arrow over the overpressure channel 140. In FIG. 2, only the selected connections between the valves 114 and the respective channels 140 and 150 are shown for reasons of clarity. This bulges a part of the flexible stamp 10 away from the stamp holder 110 towards the substrate holder 120 in order to establish the contact area 14 between the flexible stamp 10 and the substrate holder 120 including the substrate 20 carrying the resist layer 22. The edges of the contact area delimit the contact area, i.e. they delimit the part(s) of the stamp that are in contact with the substrate and the parts of the stamp that are not in contact with the substrate. Part of or the entire edge can be defined to be a contact front that can be moved along the substrate surface.

The contact area 24 is now expanded by moving one or more of the edges of the contact area 24. In the present example one contact front on the right side of the contact area is moved in the direction of the aforementioned arrow (to the right) by sequentially and subsequently switching the next aperture 112 on the right of the previous one from the underpressure to the overpressure by controlling its valve 114, as shown in the bottom pane of FIG. 2. This process is repeated until the contact area 24 is established over the entire desired area of the substrate 20, i.e. the desired portion of the imprinting pattern 12 has been brought into contact with the resist layer 22.

While the stamp is in contact with the resist layer, a curing process can be performed to solidify the resist layer such that it freezes in the relief pattern. Curing processes will be described here below.

In an alternative imprinting step, the contact area is not expanded or not entirely expanded to span the entire substrate area to be imprinted, but is also, or only displaced along the substrate surface. For this to happen, the edge at the opposite side of the moving contact front above has to be also moved in the same direction by sequentially and subsequently switching apertures within the bulged area to underpressure. Solidification of the resist layer must be performed at the contact area while the stamp is in contact with the resist material.

In the apparatus described with FIG. 1 and the method described, the stamp is located above the substrate with its pattern facing downward to the substrate. In another example the whole configuration of stamp and substrate holders is turned up-side-down such that the stamp is below the substrate still facing the substrate with its relief side. Initial contact between substrate and stamp is then made by applying a force (overpressure) to at least some of the valves holding the stamp in order to lift it to bridge the gap 30. The rest of the method can remain the same.

The rate of movement of the contact front (which is related to the rate of creation of contact area 24) is typically determined by the rate at which the next apertures 112 are switched to the overpressure, as well as by the size of the gap 30. Typical rates of contact front movement can be 0.25-1 cm/s, while applying a pressure in a range of 5-100 mbar to the apertures (vacuum nozzles). Further details can be found in US20100083855. The bridge width W associated with a contact front where the stamp is not contacted by either the stamp holder 110 or the substrate 20 may for instance be chosen between 10 and 50 mm. The bridge width, which is mainly a function of the gap size, the bending stiffness of the flexible stamp 10 and the applied pressure, influences the obtainable imprint speed and stamp release speed, assuming that the aperture pitch is chosen small enough and is thus not limiting the bridge). A larger gap allows for more substrate total thickness variation (TTV) (important for curved substrates) and makes the gap setting less critical (e.g. more variation allowed, wedge). A smaller gap allows for faster imprinting speeds. By way of non-limiting example, the imprint speed (the delay between switching an aperture 112 from underpressure to overpressure) is ~0.8-1.5 sec. per aperture for a 100 micron gap 30, e.g. 1.92 mm/sec. but can be up to 8.33 mm/sec. (0.3 sec. delay) when the gap 30 is 50 micron. Different speeds and different aperture spacings are of course equally feasible.

The rate of switching the apertures 112 to overpressure is typically chosen such that it is ensured that a good conformal contact is established between the imprinting pattern 12 and the substrate 20. Such good conformal contact is for instance achieved when the switching rate is chosen such that it allows the portion of the flexible stamp 10 to contact the substrate 20 to be pulled into the resist layer 22 by among others the capillary) forces originating from recesses in the imprinting pattern 12 of the flexible stamp 10, or onto a dry substrate 20 by material interaction forces such as e.g. Vander Waals forces or other intermolecular forces.

It appears that such force as the capillary forces, and there with the pattern on the stamp, is of large influence on the intrinsic speed with which a substrate resist may be imprinted with such pattern. Often, the pattern to be imprinted is not uniform over the entire stamp and hence such intrinsic speed may vary during imprinting of a substrate with the entire pattern.

To be able to make use of such variations in order to speed up the imprint step as a whole, in accordance with at least some embodiments of the present invention, the processing element 130 and or the control device is adapted to vary the rate at which stamp engaging elements such as the ones having the apertures 112 are switched to the overpressure depending on certain process parameters, as will be explained in more detail below. This can significantly reduce the duration of the imprinting step compared to prior art imprinting methods, in which this rate is typically constant during the imprinting step and based on a worst case scenario, i.e. where the rate of the step is based on the slowest intrinsic speed related to a particular part of the pattern. In contrast, in accordance with at least some embodiments of the present invention, it has been recognized that this rate can be increased during certain phases of the imprinting step, thereby reducing the overall duration of this step.

Once the desired contact area between the imprinting pattern 12 and the substrate 20 has been established, the resist layer 22 is subsequently developed, e.g. cured while the stamp is in contact with the resist/substrate, in any suitable manner, for instance by exposure to an external stimulus such as UV or visible light, heat or other stimuli known in the art. This solidifies the resist layer 22, which immobilizes the imprinting pattern 12 in the developed resist layer 22.

Figure 3:
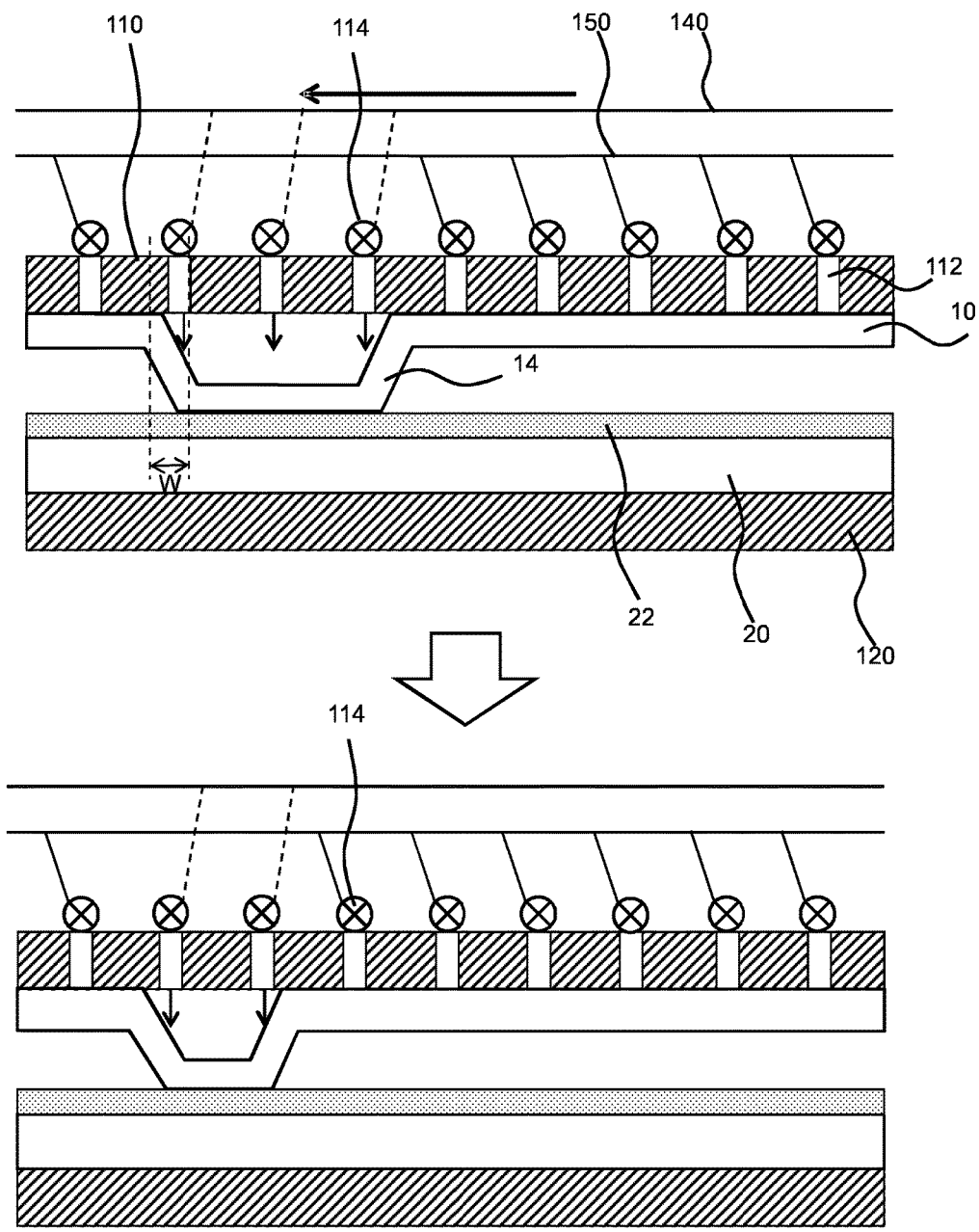
FIG. 3 schematically depicts a release cycle using the imprinting apparatus of FIG. 1.

At this stage of the method, the gap 30 may be adjusted, i.e. increased, in order to reduce the duration of the release step in which the imprinting pattern 12 is released from the developed resist layer 22. Not all gap settings facilitate automatic release of the stamp. Depending on the type of imprinting pattern 12 and resist layer 22, the stamp 10 can be attached to the imprinted developed resist layer 22 by a relatively high force between solidified resist and stamp. The release force that can be generated is higher for larger gaps 30. For instance, it is possible that a stamp 10 cannot be released from the developed resist layer 22 if the gap 30 is set to 50 micron, but can be released if this gap is 100 micron. This is due to the way the stamp is released, which as explained in more detail with the aid of FIG. 3.

During this release step, individual apertures 112 are switched from overpressure channel 140 to underpressure channel (vacuum) 150 by the processing element 130 controlling the respective valves 114, which causes the flexible stamp 10 to move up, i.e. the flexible stamp 10 is peeled away from the developed resist layer 22, thereby sealing the vacuum and shortening the bridge length W by one aperture pitch. This increases the force on the contact area 24 and as more apertures 112 are switched to underpressure to displace the contact front of the contact area 24 at the release side in the direction of the horizontal arrow, as shown in the bottom pane of FIG. 3, the bridge is further shortened until the force is equal to the release force of the imprinting pattern 12 of the flexible stamp 10 from the developed resist layer 22 on the substrate 20 carried by the substrate holder 120. This then relaxes by release of the stamp. With a larger gap 30, the forces normal to the substrate wafer are higher, thereby easing the stamp release. Also, the longer bridge length caused by this larger gap 30 allows more force to be applied before the vacuum seal is lost between the portion of the stamp 10 and the apertures 112 of the stamp holder 110 holding the flexible stamp 10 in place, e.g., the apertures 112 in contact with the outer edge of the flexible stamp 10.

At this point it is noted that during stamp release, the flexible stamp 10 is in equilibrium with the force required to release the stamp. The next aperture 112 can only be switched to underpressure, e.g. vacuum, after a portion of the flexible stamp 10 (on average) has released that has a size comparable to an aperture-to-aperture distance. Consequently, the rate of release of the flexible stamp 10 from the substrate 20 (rate of movement of release contact front) will be determined by the gap setting as well. For the example, if a flexible stamp 10 can be released using a gap of 50 and 100 microns, the release speed for a gap of 100 micron will be higher than that of a 50 micron gap, such that a higher release rate, i.e. the rate at which individual apertures 112 are switched to the underpressure along the direction indicated by the horizontal line, can be applied by the processing element 130, i.e. by periodically switching the corresponding valves 114 to the underpressure channel 150. The present inventors have realized that for the highest throughput of the overall imprinting process, the gap 30 setting for the imprinting step may be different to the gap 30 required for optimal stamp release during the release step shown in FIG. 3.

In the imprinting apparatus 100 of the prior art, the processing element 130 is typically configured to release the flexible stamp 10 from the substrate 20 including the developed resist layer 22 at a constant rate during the release step. In accordance with at least some of the embodiments of the present invention, the processing element 130 is adapted to vary the rate at which apertures 112 are switched to the underpressure depending on certain process parameters, as will be explained in more detail below. This can significantly reduce the duration of the release step compared to prior art imprinting methods, in which this rate is typically constant during the entire release step and based on a worst case scenario (compare reasoning for imprint step above also). In contrast, in accordance with at least some embodiments of the present invention, it has been recognized that this rate can be increased during certain phases of the release step, thereby reducing the overall duration of this step.

Figure 4:
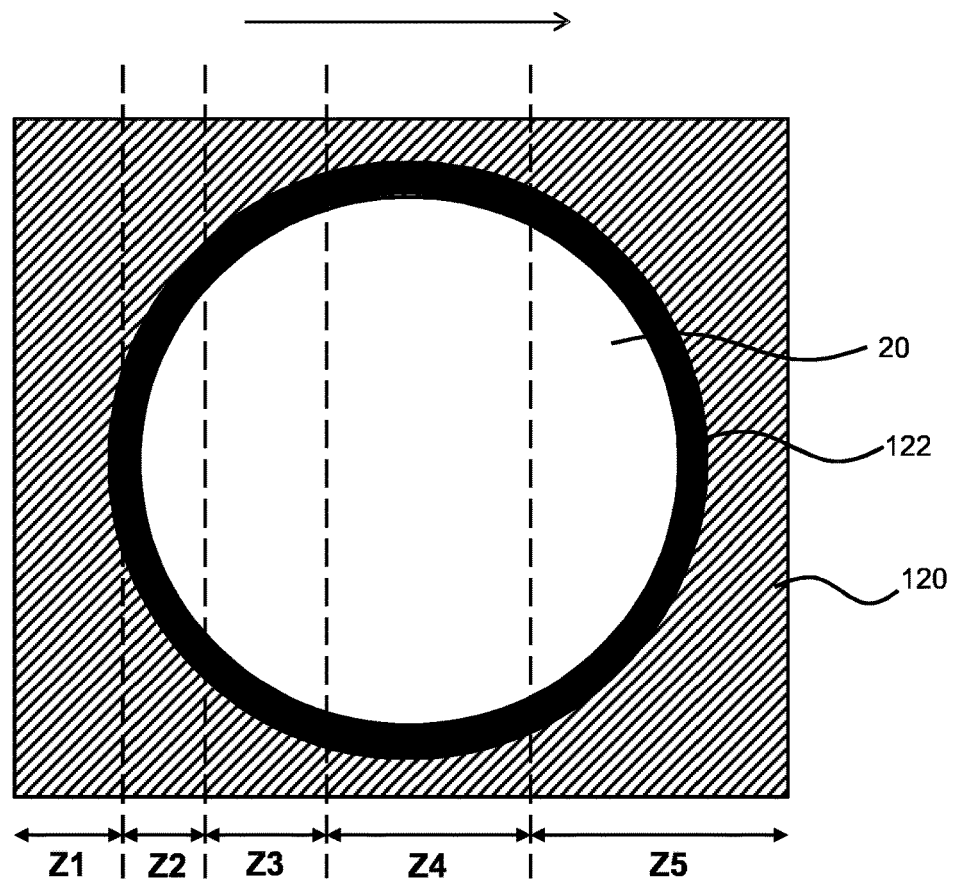
FIG. 4 schematically depicts an imprinting process according to an embodiment of the present invention.
Figure 4:
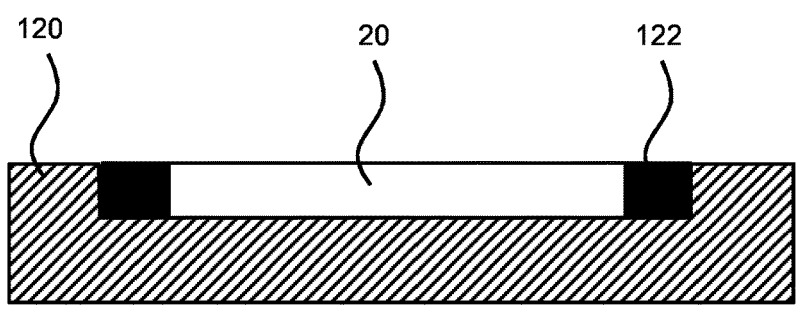

A first set of possible scenarios during which the rate of contact formation may be varied during the imprinting step is shown in FIG. 4, which depicts a top view (top pane) and a cross section (bottom pane) of the substrate holder 120. It should be understood that FIG. 4 combines several embodiments as will be explained in more detail below, which embodiments however may be equally applied in isolation without departing from the teachings of the present invention. In FIG. 4, the substrate holder 120 comprises an edge portion 122, which typically is an edge delimiting a region in which the substrate 20 is to be placed. In other words, the edge portion 122 functions as a holder for the substrate 20. In FIG. 4, the edge portion 122 is shown to have the same height as the substrate 20 by way of non-limiting example only. It should be understood that the edge portion 122 may have a different height to the substrate 20, in particular a lower height such that the edge portion 122 does not interfere with the contact between the flexible stamp 10 and an edge region of the substrate 20 adjacent to the edge portion 122 during the imprinting process. In accordance with an embodiment of the present invention, the rate at which the contact front may be moved to expand the contact area 24 during the imprinting step shown in FIG. 2 may be varied depending on which zone or region of the substrate holder 120 the contact area 24 is expanded into.

FIG. 4 identifies five different zones (Z1-Z5). The imprinting process typically starts by establishing an initial contact area 24 between the flexible stamp 10 and the substrate holder 120 in region Z1 therewith also defining first contact fronts. To this end, the region Z1 may optionally comprise one or more alignment markers (not shown) for correctly aligning the stamp holder 110 relative to the substrate holder 120. As the quality of the contact between the flexible stamp 10 and the substrate holder 120 is not crucially important in this region, the contact area 14 in region Z1 may be established at a relatively high rate, i.e. the delay between switching subsequent apertures 112 to overpressure may be relatively short.

Upon the contact front of the contact area 14 reaching region Z2, contact between the flexible stamp 10 and the substrate 20 is initiated. At this point, it is important that a good conformal contact between the flexible stamp 10 and the substrate 20 is established, and that the inclusion of air bubbles in this part of the contact region is avoided. Consequently, it is desirable that upon reaching region Z2, the rate of expanding the contact region 24 by periodically switching the next in line aperture 112 to the overpressure by control of the corresponding valve 114 is appropriately reduced. Optionally, the overpressure applied by the selected apertures 112 may be temporarily increased whilst the contact front of the contact area 14 travels through region Z2 to further improve the contact between the flexible stamp 10 and the substrate 20 in this region. This may be achieved by the processing element 130 configuring the pressure regulator 142 accordingly at this stage of the imprinting step. It is noted that this increase in overpressure may increase the leakage through at least some of the apertures 112 that are switched to underpressure (vacuum), which can reduce the fixation strength of the flexible stamp 10 to the stamp holder 110. However, this is a negligible problem as long as the contact area 24 is relatively small.

Upon the contact front of the contact area 24 expanding into region Z3, the conformal contact between the flexible stamp 10 and the substrate 20 has become well-established, such that at this point the rate of contact front movement (expansion rate of the contact area 24) may be increased again, i.e. by increasing the rate at which the valves 114 of the next in line apertures 112 are switched to the overpressure channel 140. At the same time, it is preferable to reduce the overpressure to its initial value by the processing element 130 controlling the pressure regulator 142 accordingly in case this overpressure was temporarily increased as previously explained. The contact front movement rate is typically increased when a predetermined amount of the contact area 24 has been established. The predetermined amount may be determined through experimentation and will typically depend upon the materials used, such as the material of the flexible stamp 10 and the resist layer 22. During the imprinting step, this higher rate may be maintained until region Z5 is reached.

Similarly, during the release step the forces that have to be overcome to release the flexible stamp 10 from the developed resist layer 22 gradually increase from the edge towards the center of the substrate 20. Consequently, the rate at which underpressure is applied to selected apertures 112 in order to gradually reduce the contact area between the flexible stamp 10 and the developed resist layer 22 may be reduced in central region Z4 compared to edge regions Z3 and Z5.

At this point it is noted that the variation of the contact front during release of the stamp from the substrate, i.e. the rate at which apertures 112 are switched to underpressure, in outer regions Z3 and Z5 compared to central region Z4 may be independent of the variation of the contact front formation front, i.e. the rate at which apertures 112 are switched to overpressure, in regions Z1-Z3. In other words, these variations are independent embodiments of the present invention, which embodiments optionally may be combined with each other.

Figure 5:
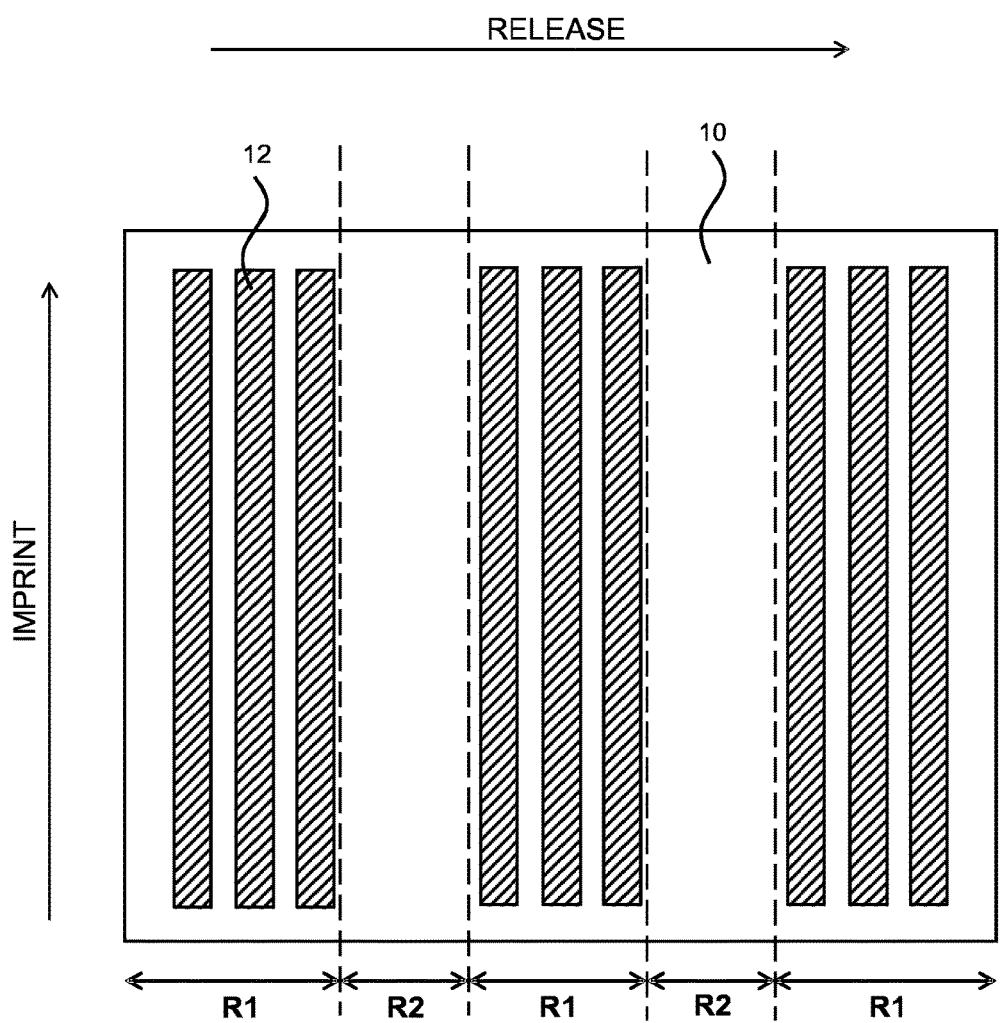
FIG. 5 schematically depicts an imprinting process according to another embodiment of the present invention.

FIG. 5 schematically depicts a flexible stamp 10 having an imprinting pattern 12 with regions having different feature densities. In FIG. 5, a first region R1 having a high feature density and a second region R2 having a low feature density (e.g. no features) are shown by way of non-limiting example; it will be immediately understood by the person skilled in the art that a typical flexible stamp 10 for use in accordance with embodiments of the imprinting method of the present invention may comprise many different regions characterized by different feature densities. It should be understood that FIG. 5 combines several embodiments as will be explained in more detail below, which embodiments however may be equally applied in isolation without departing from the teachings of the present invention.

It has been recognized by the present inventors that in case a flexible stamp 10 comprises an imprinting pattern 12 having such different regions with different feature densities, the rate at which individual apertures 112 are switched to underpressure to release the imprinting pattern from the developed resist layer 22 may be varied in accordance with these different regions. In particular, regions R1 having a relatively high feature density exhibit a higher effective contact area (this effective contact area is not to be confused with contact area 24. With effective contact area is meant that, because of the denser features there may be more relief giving larger area of contact between the stamp material and the resist/substrate.) between the corresponding features of the imprinting pattern 12 and the developed resist layer 22, which means that a higher force will be required to release region R1 of the flexible stamp 10 from the developed resist layer 22. Consequently, this region is preferably released at a lower rate than regions R2 in order to ensure that the flexible stamp 10 is released from the developed resist layer 22 without adverse effects.

Optionally, the overpressure applied to the apertures 112 not (yet) switched to the underpressure may be reduced during the release step, as this will result in less leakage and therefore a better vacuum for the apertures 112 switched to the underpressure. This creates a higher release force which in particular will help in releasing the flexible stamps 10 with high aspect ratio imprinting patterns 12.

In an embodiment, it is furthermore recognized that for certain types of imprinting patterns 12, the direction in which the contact front of the contact area 24 is moved forward during the imprinting step may be different to the direction in which the contact front of the contact area 24 should be released from the developed resist layer 22 during the release step. In this context, a different direction is intended to mean that the path the contact front follows during the release step is different to the path the contact front follows during the imprinting step; in other words, a different direction does not include the reverse of the direction of the imprinting step.

A non-limiting example of such an imprinting pattern is a grating, which is schematically depicted in FIG. 5. In order to take full benefit of the capillary forces that assist the formation of the conformal contact between the flexible stamp 10 and the substrate 20, the imprinting step should be performed in parallel with the grating lines. In contrast, the release of the imprinting pattern 12 from the developed resist layer 22 can be more easily achieved when releasing the imprinting pattern 12 from the developed resist layer 22 in a direction perpendicular to the grating lines (the shaded lines in regions R1 of FIG. 5). Other examples of imprinting patterns for which such a different direction between imprinting and release is beneficial will be apparent to the skilled person. As previously explained, such multidirectional imprinting and release may be facilitated by a stamp holder 110 as shown in FIG. 6.

At this point, it is noted that the embodiments of the imprinting apparatus 100 of the present invention are shown to have apertures 112 as stamp engaging elements of the flexible stamp 10 by way of non-limiting example only. It is for instance equally feasible to replace the apertures 112 by mechanical stamp engaging elements, e.g. plungers or the like, which mechanical stamp engaging elements may be individually controlled by the processing element 130, such that in a first configuration the mechanical stamp engaging elements pull a portion of the flexible stamp towards the stamp holder 110, and in a second configuration the mechanical stamp engaging elements push a portion of the flexible stamp 10 against the substrate 20. Also electrical elements can be used based on e.g. magnets or electromagnets. The electrical elements can be used in conjunction with a flexible stamp having a back plane that reacts to magnetic forces, e.g. a backplane that is made of a suitable metal. The person skilled in the art will know how to implement those stamp engagement elements and the corresponding driving means.

It will be immediately recognized by the person skilled in the art that such mechanical stamp engaging elements or electrical stamp engaging elements or other may be controlled in an entirely analogous manner, e.g. by varying the rate at which these mechanical stamp engaging elements are switched between first and second configurations during the imprinting step and/or the rate at which these mechanical stamp engaging elements are switched between second and first configurations during the release step. It is furthermore noted for the avoidance of doubt that the flexible stamp 10 may be secured on such mechanical stamp engaging elements in any suitable manner, e.g. using clamping means, adhesive means, suction means, and so on. As such securing means are well-known per se, this will not be explained in further detail for the sake of brevity only.

A computer program product comprising computer program code may be provided that is downloadable from a data network or stored on a computer-readable data carrier and that implements one or more embodiments of the method of the present invention when executed on the processing element 130. The computer program code typically is code that can be executed on the processing element 130 of the control device present in the imprinting apparatus 100, and which causes the processing element 130 control the control device, and there with the imprinting apparatus 100 including such device, in accordance with the one or more embodiments of this method. Thus the control device and/or the imprinting apparatus 100 may include the computer program product. Any suitable computer-readable data carrier may be used; non-limiting examples of such computer-readable data carriers include a CD, DVD, Flash memory, an Internet-accessible data carrier such as a solid state or magnetic disk, which disk may be located in an Internet server, and so on.

In an embodiment, aspects of the computer program code may be derived from a design file specifying the imprinting pattern 12 of the flexible stamp 10, such as a GDSII file. In particular, such a file may be automatically evaluated to establish the feature variations in the imprinting pattern 12 and to derive the optimal imprinting process parameters such as the required rate variations in the imprinting step, imprinting direction, change in gap dimensions between imprinting and release steps, required rate variations in the release step, release direction determine predetermined distances over which contact front movement rate should be kept constant and so on. These derived parameters may be included in the imprinting apparatus control program to be executed by the processing element 130. Such inclusion of the process parameters can be done in the form of lookup table.

The lookup table can be given the parameters based on the design file up front, but alternatively the apparatus can comprise an inspection device such as a camera to inspect an installed flexible stamp in order to derive information realted to the printing pattern design. Software to determine the aforementioned parameters from such file can again be used.

The present invention will now be explained with the aid of the following examples. It should be understood that these examples are for illustrative purposes only, and are not intended to limit the scope of invention in any way.

In the following examples, a number of patterns were printed using a PDMS stamp with the specified pattern to imprint a silicon substrate comprising a sol-gel resist layer (Philips UV sol-gel V4, which is available from Philips Innovation Services, Eindhoven, The Netherlands). In each example, the throughput time of an imprinting cycle in which a constant imprinting and release rate is used (labeled stationary process) is compared to an imprinting cycle in which at least one of the imprinting rate and release rate is varied (labeled dynamic process).

EXAMPLE 1

PDMS stamp: Checkerboard pattern with 400 nm pitch, 100 nm depth.
Stationary process:
Imprint cycle: 100 micron gap, 20 mBar overpressure, 1 sec delay between switching neighboring apertures 112 to overpressure.
Release cycle: 100 micron gap, 20 mBar overpressure, 1 sec delay between switching neighboring apertures 112 to underpressure.
Total process time: 160 sec.
Dynamic process:
Imprint cycle: 50 micron gap; 20 mBar overpressure; 0.3 sec delay between switching neighboring apertures 112 to overpressure.
Release cycle: 100 micron gap; 20 mBar overpressure; 0.5 sec between switching neighboring apertures 112 to underpressure.
Total process time: 64 sec.

EXAMPLE 2

The same stamp and stationary process as in example 1 were used. The dynamic process conditions were altered as follows:
Dynamic process:
Imprint cycle: 50 micron gap; 20 mBar overpressure; 0.2 sec delay between switching neighboring apertures 112 to overpressure.
Release cycle: 100 micron gap; 10 mBar overpressure; 0.3 sec delay between switching neighboring apertures 112 to underpressure.
Total process time: 40 sec.

EXAMPLE 3

The same stamp as in example 1 was used in a set up as shown in FIG. 4. The dynamic process conditions were altered as follows. The imprint step was divided into five stages:
a. Contacting the substrate holder 120;
b. Advancing the stamp from the substrate holder 120 onto the substrate 20;
c. advancing mainly over the substrate 20;
d. advancing the stamp from the substrate 20 onto the substrate holder 120; and
e. further contacting the substrate holder 120.
The release step was divided into five stages:
a. releasing from the substrate holder 120;
b. releasing the stamp from the substrate holder 120 to the substrate 20;
c. releasing mainly over the patterned substrate 20;
d. releasing the stamp from the substrate 20 to the substrate holder 120; and
e. final release from the substrate holder 120.
Stationary process:
Imprint cycle: 75 micron gap, 20 mBar overpressure, 1 sec delay between switching neighboring apertures 112 to overpressure.
Release cycle: 75 micron gap; 20 mBar overpressure; 1.3 sec delay between switching neighboring apertures 112 to underpressure.
Total processing time: 184 sec.
Dynamic process:
Imprint cycle: 100 micron gap; 20 mBar overpressure;
stage a: 0.15 sec delay (23x) between switching neighboring apertures 112 to overpressure;
stage b: 1 sec delay (4x) between switching neighboring apertures 112 to overpressure;
stage c: 0.3 sec delay (26x) between switching neighboring apertures 112 to overpressure;
stage d: 1 sec delay (4x) between switching neighboring apertures 112 to overpressure;
stage e: 0.15 sec delay (23x) between switching neighboring apertures 112 to overpressure;
Total duration imprinting step: 22.7 sec.
Release cycle: 100 micron gap, 20 mBar overpressure
stage a: 0.15 sec delay (23x) between switching neighboring apertures 112 to underpressure;
stage b: 0.3 sec delay (4x) between switching neighboring apertures 112 to underpressure;
stage c: 0.3 sec delay (26x) between switching neighboring apertures 112 to underpressure;
stage d: 0.3 sec delay (4x) between switching neighboring apertures 112 to underpressure; and
stage e: 0.15 sec delay (23x) between switching neighboring apertures 112 to underpressure.
Total duration release step: 14.1 sec.
Total processing time: 36.8 sec.

EXAMPLE 4

The same stamp and stationary process as an example 3 were used. The dynamic process was altered as follows:
Dynamic process:
Imprint cycle: 50 micron gap, 20 mBar overpressure;
stage a: 0.1 sec delay (23x)
stage b: 0.3 sec delay (4x)
stage c: 0.2 sec delay (26x)
stage d: 0.3 sec delay (4x)
stage e: 0.1 sec delay (23x)
Total duration imprint step: 12.2 sec
Release cycle: 100 micron gap; 10 mBar overpressure;
stage a: 0.1 sec delay (23x)
stage b: 0.3 sec delay (4x)
stage c: 0.3 sec delay (26x)
stage d: 0.3 sec delay (4x)
stage e: 0.1 sec delay (23x)
Total duration release step: 14.8 sec
Total processing time: 27 sec.

EXAMPLE 5

The same stamp and stationary process as an example 3 were used. Alignment markers were added at 4 cm left and right from the center of the substrate.

The imprint step was divided into five stages:
a. Contact and advancing the stamp on the substrate;
b. first alignment marker area on the substrate;
c. advancing the stamp on the substrate;
d. second alignment marker area on the substrate;
e. advancing the stamp on the substrate.

A single stage release step was applied in which the stamp was released from the substrate patterned mainly with nano-patterns and small areas of micrometer-sized patterns.

Stationary process:
Imprint cycle: 100 micron gap; 20 mBar overpressure; 1 sec delay between switching neighboring apertures 112 to overpressure.
Release cycle: 100 micron gap; 20 mBar overpressure; 1.3 sec delay between switching neighboring apertures 112 to underpressure.
Total process time: 184 sec.

Dynamic process:
Imprint cycle: 50 micron gap; 25 mBar overpressure;
stage a: 0.15 sec delay (23x) between switching neighboring apertures 112 to overpressure;
stage b: 1 sec delay (4x) between switching neighboring apertures 112 to overpressure;
stage c: 0.3 sec delay (26x) between switching neighboring apertures 112 to overpressure;
stage d: 1 sec delay (4x) between switching neighboring apertures 112 to overpressure; and
stage e: 0.15 sec delay (23x) between switching neighboring apertures 112 to overpressure.
Total duration imprint step: 22.7 sec
Release cycle: 100 micron gap; 10 mBar overpressure, 0.3 sec delay (80x) between switching neighboring apertures 112 to underpressure.
Total process time: 46.7 sec.

In all the examples above, the pattern imprinted on the substrate using the dynamic process was demonstrated to be of a comparable quality to the pattern imprinted using the static process.

The above examples clearly demonstrate that dynamic control of the process parameters such as the gap 30 in between the stamp holder 110 and the substrate holder 120, variation of the imprinting rate and the release rate during the imprinting and release steps respectively and/or variation of the overpressure between imprinting and release steps can significantly reduce the overall process time of a single imprinting cycle without adversely affecting the quality of the pattern imprinted on the substrate 20.

In the above example apparatus and method imprinting and release was described to be performed in consecutive steps. In alternative setup, these steps can be performed partly parallel or completely parallel as in a reel to reel like fashion. In an example of such a method, release of the stamp is begun by moving a release contact front from one end of an already created contact area (effectively to decrease the contact area) while imprint is performed by moving another contact front of the same contact area thereby counteracting the effect of the release at least partly. The effect of such action is that the contact area moves across the substrate allowing continuous imprint process (reel to reel). If the rates of movement of the contact areas are equal, a steady state (non-expanding or decreasing) but moving contact area is created. In this case, adjustments of rates to both moving contact fronts need to be done at the same time to not disturb the steady state situation.

It is also possible to have different rates of movements of the release and imprint contact fronts. However, if the latter is higher than the former, the contact area will decrease, necessitating a time out of release if the contact area becomes to small. Not that continuous imprint with different rates is then still possible, but then release is periodically performed. In this way a contact area size can be controlled, i.e. kept below a particular size or even between desired sizes in a continuous process while the benefits of the invention can be enjoyed.

The invention has been described using a modified device as described in US20100083855, U.S. Pat. No. 8,172,968 or US20050173049, where the system comprise a plurality of stamp engaging elements for controlling the contacting or releasing speed. However, the invention is equally well applicable to apparatuses described in e.g. US20040011231 or US20040197712, which, while they do have again substrate holders and stamp holders, differ from the above examples in that no plurality of stamp engagement elements are present, but rather there are larger stamp engagement elements that are able to manipulate the entire stamp to drape US20040011231 or force US20040197712 it towards the substrate using mechanical means and/or air pressure. The concept of the invention remains the same when applied to such apparatuses. The means for manipulating the stamps must be operated to provide the variable movement rate during contacting and/or during releasing of the stamp from the substrate as described above. The detailed way to do this will be evident from the corresponding disclosures of the apparatuses as there the person skilled in the art will find description of how to build such device, perform an imprinting or releasing step in order to be able to modify the apparatus with a control device according to the invention which is able to control the relevant parts of the manipulating systems of the corresponding apparatuses.

In summary, it is disclosed is a method and apparatus for contacting a relief stamping surface of a flexible stamp with a receiving surface of a substrate. The method and apparatus can be used in an imprinting method. During the method and with the apparatus, creation or breaking of contact near a contact front (border) of a preformed contact area in which a part of a locally bent relief stamping surface is in contact with the stamp receiving surface, the speed of such creation or breaking is varied for different parts of the flexible stamp such that this contact front moves over the stamp receiving surface with different speed at different locations along a contact front movement trajectory on the stamp receiving surface. This may be used to optimize throughput when using such method and apparatus.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:
1. A method for contacting a relief stamping surface of a flexible stamp to a stamp receiving surface of a substrate within an imprint lithography process, comprising:

holding and manipulating the flexible stamp and the substrate such that when the flexible stamp and the substrate are held, the flexible stamp can be locally bent to create, on a part of the stamp receiving surface, a contact area within which a part of the relief stamping surface is in contact with the stamp receiving surface while a further part of the stamping surface is not in contact with the stamp receiving surface, at least a part of the border of the contact area defining a contact front;

contacting the relief stamping surface to the stamp receiving surface to create contact near or at the contact front such that the contact front moves with a movement rate along the stamp receiving surface of the substrate along a movement direction substantially perpendicular to the contact front and away from the contact area; and releasing the relief stamping surface from the stamp receiving surface in a contact area to break contact near or at the contact front such that the contact front moves with a movement rate along the stamp receiving surface of the substrate along the stamp receiving surface of the substrate along a movement direction substantially perpendicular to the contact front and towards the contact area, wherein contact is created or broken such that the movement rate has a first constant value over a first predetermined distance along the movement direction, the first predetermined distance including one of the at least two different locations, wherein contact is created or broken such that the movement rate has a second constant value over a second predetermined distance along the movement direction, the second predetermined distance including the other of the at least two different locations, the first constant value being different from the second constant value, and wherein the first predetermined distance corresponds to a dimension of a first area of the relief stamping surface with a first relief topography and the second predetermined distance corresponds to a dimension of a second area of the relief stamping surface with a second relief topography that is different from the first relief topography.

2. The method as claimed in claim 1, wherein the first and second predetermined distances are retrieved from a lookup table in which values for the first predetermined distance and the second predetermined are stored.

3. The method as claimed in claim 1, further comprising inspecting the relief stamping surface to determine the first area and the second area based on relief topography; and deriving from the first area the first predetermined distance and from the second area the second predetermined distance along a direction in which movement of the contact front is to occur.

4. The method as claimed in claim 1, further comprising curing to allow solidification of a resist layer present on or forming the receiving surface of the substrate while the resist layer is in contact with the relief stamping surface.

5. The method as claimed in claim 1, wherein the movement direction of contacting and releasing are chosen to be any one of the following: the same, opposite to each other, and making an angle towards each other.

6. The method as claimed in claim 1, further comprising providing a stamp holder for holding the flexible stamp and a plurality of stamp engaging elements, each of the stamp engaging elements being switchable between a first configuration in which the flexible stamp is attached to the stamp holder and a second configuration in which the flexible stamp is released away from the stamp holder, and wherein the method further comprises:

successively switching stamp engagement elements from the first state to the second state for creating contact or breaking contact.

7. The method as claimed in claim 1, further comprising providing a stamp holder having a stamp engaging surface and a substrate holder having a substrate engaging surface, wherein the stamp engaging surface and the substrate engaging surface are parallel to each other and distanced from each other with a gap.

8. A control device for controlling an apparatus for contacting a relief stamping surface of a flexible stamp to a stamp receiving surface of a substrate, wherein the control device is configured to cause the apparatus to:

hold and manipulate the flexible stamp and the substrate such that when the flexible stamp and the substrate are held, the flexible stamp can be locally bent to create, on a part of the stamp receiving surface-, a contact area within which a part of the relief stamping surface is in contact with the stamp receiving surface while a further part of the stamping surface is not in contact with the stamp receiving surface, at least a part of the border of the contact area defining a contact front;

contact the relief stamping surface to the stamp receiving surface to create contact near or at the contact front such that the contact front moves with a movement rate along the stamp receiving surface of the substrate along a movement direction substantially perpendicular to the contact front and away from the contact area; and release the relief stamping surface from the stamp receiving surface in a contact area to break contact near or at the contact front such that the contact front moves with a movement rate along the stamp receiving surface of the substrate along the stamp receiving surface of the substrate along a movement direction substantially perpendicular to the contact front and towards the contact area, wherein contact is created or broken such that the movement rate has a first constant value over a first predetermined distance along the movement direction, the first predetermined distance including one of the at least two different locations, wherein contact is created or broken such that the movement rate has a second constant value over a second predetermined distance along the movement direction, the second predetermined distance including the other of the at least two different locations, the first constant value being different from the second constant value, and wherein the first predetermined distance corresponds to a dimension of a first area of the relief stamping surface with a first relief topography and the second predetermined distance corresponds to a dimension of a second area of the relief stamping surface with a second relief topography that is different from the first relief topography.

9. The control device as claimed in claim 8, wherein the flexible stamp is bent to create, on a part of the stamp receiving surface, a contact area within which a part of the relief stamping surface is in contact with the stamp receiving surface while a further part of the stamping surface is not in contact with the stamp receiving surface, at least a part of the border between the contact area and the non-contact area defining a contact front.

10. The control device as claimed in claim 8, wherein the apparatus further comprises a stamp holder for holding the flexible stamp and a plurality of stamp engaging elements, each of the stamp engaging elements being switchable between a first configuration in which the flexible stamp is attached to the stamp holder and a second configuration in which the stamp is released from the stamp holder.

11. The control device as claimed in claim 10, wherein each of the plurality of stamp engaging elements comprises an aperture for providing an underpressure to attach the flexible stamp or for providing an overpressure to release the flexible stamp, and wherein the control device further comprises a pressure regulator including switchable valves for individually setting the underpressure or overpressure of each of the apertures of the plurality of stamp engaging elements.

12. The control device as claimed in claim 10, wherein each of the plurality of stamp engaging elements comprises an electromagnet for providing a magnetic force to attach the flexible stamp or for providing a magnetic force to release the flexible stamp, and wherein the control device further comprises an electrical equipment for switching electrical signals to each individual one of the electromagnets of the plurality of stamp engaging elements.

13. The control device as claimed in claim 12, comprising a switch unit for providing switching settings for each of the plurality of stamp engagement elements such that the settings can be variable during contacting or releasing.

14. A non-transitory computer-readable medium having one or more executable instructions stored thereon, which when executed by a processor, cause the processor to perform a method for contacting a relief stamping surface of a flexible stamp to a stamp receiving surface of a substrate within an imprint lithography process, the method comprising:

holding and manipulating the flexible stamp and the substrate such that when the flexible stamp and the substrate are held, the flexible stamp can be locally bent to create, on a part of the stamp receiving surface, a contact area within which a part of the relief stamping surface is in contact with the stamp receiving surface while a further part of the stamping surface is not in contact with the stamp receiving surface, at least a part of the border of the contact area defining a contact front;

contacting the relief stamping surface to the stamp receiving surface to create contact near or at the contact front such that the contact front moves with a movement rate along the stamp receiving surface of the substrate along a movement direction substantially perpendicular to the contact front and away from the contact area; and releasing the relief stamping surface from the stamp receiving surface in a contact area to break contact near or at the contact front such that the contact front moves with a movement rate along the stamp receiving surface of the substrate along the stamp receiving surface of the substrate along a movement direction substantially perpendicular to the contact front and towards the contact area, wherein contact is created or broken such that the movement rate has a first constant value over a first predetermined distance along the movement direction, the first predetermined distance including one of the at least two different locations, wherein contact is created or broken such that the movement rate has a second constant value over a second predetermined distance along the movement direction, the second predetermined distance including the other of the at least two different locations, the first constant value being different from the second constant value, and wherein the first predetermined distance corresponds to a dimension of a first area of the relief stamping surface with a first relief topography and the second predetermined distance corresponds to a dimension of a second area of the relief stamping surface with a second relief topography that is different from the first relief topography.

* * * * *